United States Patent
Yamada et al.

[11] Patent Number: 5,998,050
[45] Date of Patent: Dec. 7, 1999

[54] COMPOSITE METAL OXIDE MATERIAL

[75] Inventors: Yasuji Yamada, Tokyo; Masaru Nakamura, Mitaka; Noriyuki Tatsumi; Jiro Tsujino, both of Tokyo; Kanshi Ohtsu, Musashino; Yasuo Kanamori, Tokyo; Minoru Tagami, Funabashi; Atsushi Kume, Tokyo; Yuh Shiohara, Chigasaki; Shoji Tanaka, Tokyo, all of Japan

[73] Assignees: International Superconductivity Technology Center; Hitachi Cable Ltd.; Hokkaido Electric Power Co., Inc.; Kyushu Electric Power Co., Inc.; The Kansai Electric Power Co., Inc.; Fujikura, Ltd., all of, Japan

[21] Appl. No.: 08/769,353

[22] Filed: Dec. 19, 1996

Related U.S. Application Data

[62] Division of application No. 08/279,416, Jul. 25, 1994, Pat. No. 5,627,142.

[30] Foreign Application Priority Data

Jul. 27, 1992 [JP] Japan ................................ 5-184712

[51] Int. Cl.$^6$ ............................ B32B 18/00; H01L 39/00
[52] U.S. Cl. .......................... 428/700; 428/701; 428/930; 505/230; 505/234; 505/238; 505/239; 505/701; 505/704
[58] Field of Search .................... 505/230, 234, 505/238, 239, 701, 704; 428/689, 699, 700, 701, 702, 930

[56] References Cited

U.S. PATENT DOCUMENTS

| | | | |
|---|---|---|---|
| 4,916,114 | 4/1990 | Hoenig | 505/410 |
| 5,055,445 | 10/1991 | Belt et al. | 505/452 |
| 5,151,408 | 9/1992 | Tanaka et al. | 505/476 |
| 5,162,296 | 11/1992 | Yamazaki | 505/400 |
| 5,206,213 | 4/1993 | Cuomo et al. | 505/410 |
| 5,358,927 | 10/1994 | Inam et al. | 505/434 |

OTHER PUBLICATIONS

A. Inam et al., "a–axis oriented epitaxial YBa$_2$ Cu$_3$ O$_{7-x}$ Pr$_2$ Cu$_3$ O$_{7-y}$ heterostructures" *Appl. Phys. Lett.*, vol. 57, No. 23., pp. 2484–2486, Dec. 3, 1996.

Ch. Krauns et al., "Wetting between prospective crucible materials and the Ba–Cu–O melt" *J. Mater. Res.*, vol. 9, No. 6, pp. 1513–1518, Jun. 1664.

Chemical Abstracts, vol. 114, No. 24, p. 670, 114: 238500 K, Jun. 17, 1991.

Chemical Abstracts, vol. 114, No. 24, pp. 669–670, 114: 238498r, Jun. 17, 1991.

Chemical Abstracts, vol. 117, No. 4, p. 809, 117: 37980 e, Jul. 27, 1992.

*Primary Examiner*—Marie Yamnitzky
*Attorney, Agent, or Firm*—Lorusso & Loud

[57] ABSTRACT

A composite material is disclosed which includes a substrate, an oriented film provided on a surface of the substrate and formed of a crystal of a Y123 metal oxide of the formula LnBa$_2$Cu$_3$O$_y$, wherein Ln stands for Y or an element belonging to the lanthanoid and y is a number of 6–7, and a layer of a Y123 metal oxide of the formula LnBa$_2$Cu$_3$O$_y$, wherein Ln stands for Y or an element belonging to the lanthanoid and y is a number of 6–7 formed on the oriented film.

7 Claims, 3 Drawing Sheets

COMPOSITE METAL OXIDE MATERIAL

This application is a division of application Ser. No. 08/279416, filed Jul. 25, 1994, now U.S. Pat. No. 5,672,142.

BACKGROUND OF THE INVENTION

This invention relates to a composite material metal oxide layer of a Y123 crystal structure. The present invention is also concerned with a method of preparing such a composite material.

One known method for the preparation of a metal oxide crystal having a Y123 crystal structure includes contacting a seed material with a molten mixture of metal oxides to allow the desired crystal to grow on the seed material. The term "Y123 crystal structure" used in the present specification and claims is intended to refer to a crystal structure similar to that of $YBa_2Cu_3O_{7-x}$ where x is a number of 0–1. The term "Y123 metal oxide", is intended to refer to a metal oxide having a Y123 crystal structure.

As the seed crystal, a magnesia single crystal, a Sm123 metal oxide crystal or a Y123 metal oxide crystal has been hitherto used. The use of a magnesia single crystal has a problem that the crystal which has grown on the magnesia seed crystal forms a Y123 polycrystal rather than a single Y123 crystal. When a Y123 crystal is used as the seed crystal, the molten mixture climbs along the seed crystal so that a holder thereof will be wetted and reacted with the molten mixture.

SUMMARY OF THE INVENTION

It is, therefore, an object of the present invention to provide a composite material having a Y123 metal oxide crystal layer grown on a thin Y123 metal oxide film and having excellent crystallinity and crystal orientation.

It is another object of the present invention to provide a method for preparing such a composite material.

In accomplishing the foregoing objects, there is provided in accordance with one aspect of the present invention a composite material comprising a substrate, an oriented film provided on a surface of said substrate and formed of a metal oxide which has a crystal structure of a Y123 metal oxide and which has the formula:

$$LnBa_2Cu_3O_y$$

wherein Ln stands for Y or an element belonging to the lanthanoid and y is a number of 6–7, and a layer of a metal oxide crystal provided over a surface of said oriented film and having the formula:

$$LnBa_2Cu_3O_y$$

wherein Ln stands for Y or an element belonging to the lanthanoid and y is a number of 6–7.

In another aspect, the present invention provides a method of producing a composite material having a layer of a first metal oxide having the formula:

$$LnBa_2Cu_3O_y$$

wherein Ln stands for Y or an element belonging to the lanthanoid and y is a number of 6–7, said method comprising the steps of:

providing a seed material including a substrate, and an oriented film having a thickness of 0.01–1 μm and provided over a surface of said substrate, said oriented film being formed of a second metal oxide which has a crystal structure of a Y123 metal oxide and which has the formula:

$$LnBa_2Cu_3O_y$$

wherein Ln stands for Y or an element belonging to the lanthanoid and y is a number of 6–7; and contacting said oriented film with a liquid phase which contains a melt composed of Cu, Ba and O and in which a solid phase is present at a position separated by said liquid phase from the position at which said oriented film contacts said liquid phase, said solid phase providing said liquid phase with solutes which constitute said first metal oxide so that said solutes are transported to the position at which said oriented film and said liquid phase contact, thereby permitting said first metal oxide to grow on said oriented film as primary crystals.

The composition of the first metal oxide may be the same as or different from that of the second metal oxide.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
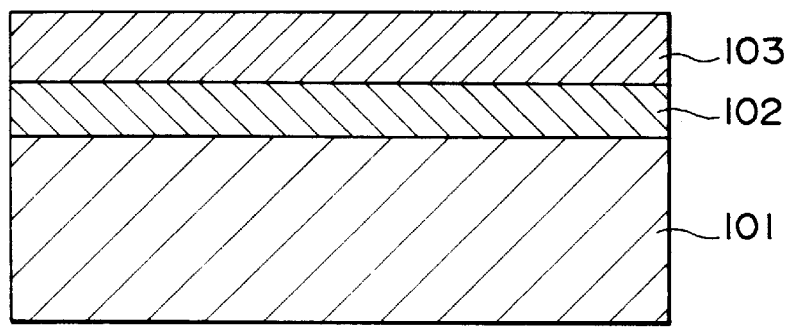
FIG. 1 is a sectional view schematically showing a composite material according to the present invention.

The composite material according to the present invention includes a seed material on which a layer of a metal oxide crystal having a Y123 crystal structure is formed. The seed material is a composite material composed of a substrate, and an oriented film provided on a surface of the substrate and formed of a metal oxide which has a crystal structure of a Y123 metal oxide and which has a composition expressed by the formula:

$$LnBa_2Cu_3O_y$$

wherein Ln stands for Y or an element belonging to the lanthanoid (including La, Ce, Or, Nd, Pm, Sm, Eu, Gd, Tb, Dy, Ho, Er, Tm, Yb and Lu) and y is a number of 6–7.

The substrate is preferably formed of a material which is substantially unwettable with a melt composed of Ba, Cu and O. Examples of suitable substrates include oxides containing an alkaline earth metal, such as alkaline earth metal oxides and mixed oxides containing an alkaline earth metal. The use of a MgO crystal is particularly preferred.

Whether or not the substrate is wettable may be determined as follows:

A sample having a length of 50 mm, a thickness of 3 mm and a width of 15 mm is immersed by a depth of 5 mm for 15 hours in a melt of a mixture of Bao and CuO (Ba/Cu molar ratio of 3:7) contained in a 10 ml crucible, with the longitudinal axis of the sample being oriented normal to the surface of the melt. The melt is maintained at 1,050° C.

When the distance through which the melt climbs along the sample after 15 hours immersion is not greater than 5 mm, then the sample is regarded as being unwettable.

The oriented film of a Y123 crystal is provided over a surface of the substrate. The direction of the orientation of the film is not specifically limited. For example, an oriented film whose c-axis is oriented in the direction normal to the plane of the substrate or whose a-axis is oriented in the direction normal to the plane of the substrate may be suitably used.

When the seed material has an a-axis oriented film, a layer of a crystal which is grown thereon is also a-axis oriented. Thus, the use of a seed material having an a-axis oriented film is advantageous in the preparation of a good quality SIS junction, since the thickness of the I-layer can be made nearly equal to the coherence length of the S-layer.

The thickness of the oriented film of a Y123 crystal is preferably 0.01–1 $\mu$m. The crystallinity of a Y123 crystal layer grown on the oriented film generally depends upon the thickness of the oriented film. Thus, a thickness of the oriented film greater than 1 $\mu$m is not preferable since the Y123 crystal layer tends to form a polycrystal. Too small a thickness below 0.01 $\mu$m also results in the formation of a polycrystal.

The oriented film may be easily formed on the substrate by a plasma deposition method in which a raw material oxide powder of Ln—Ba—Cu—O is fed into a high frequency plasma to vaporize same and to permit the vapors to deposit on a surface of the substrate.

The thus obtained composite seed material is used for forming thereon of a layer of a Y123 metal oxide crystal having the formula:

$$LnBa_2Cu_3O_y$$

wherein Ln stands for Y or an element belonging to the lanthanoid and y is a number of 6–7. The symbol Ln in the Y123 metal oxide crystal layer may be the same as or different from that in the oriented film of the seed material. Such a Y123 crystal layer may be suitably obtained by contacting the oriented film of the seed material with a melt of a mixture of metal oxides containing solutes or components which constitute the Y123 crystal under conditions so that the Y123 crystal is grown as primary crystals. In this case, even when the oriented film of the seed material is not completely oriented, the Y123 crystal grown thereon has good crystallinity and crystal orientation.

FIG. 1 schematically shows the construction of the thus obtained product. Designated as 101 is the substrate, as 102 the oriented film and as 103 the Y123 crystal layer grown on the oriented film 102.

The formation of the Y123 crystal layer 103 on the seed material may be suitably performed by a method including a step of contacting the oriented film 102 with a liquid phase which contains a melt composed of Ba, Cu and O and in which a solid phase is present at a position separated by the liquid phase from the position at which the oriented film 102 contacts the liquid phase, the solid phase providing the liquid phase with solutes or components which constitute the desired Y123 metal oxide crystal 103 so that the solutes are transported to the position at which the oriented film and the liquid phase contact, thereby permitting the desired metal oxide crystal 103 to grow on the seed material as primary crystals.

The solid phase to be used in the method of the present invention is preferably a Y-series 211 metal oxide. The term "Y-series 211 metal oxide" used in the present specification and claims is intended to refer to a metal oxide having the formula:

$$Ln_2BaCuO_{5-x}$$

wherein Ln is as defined above and x is a number of 0–1.

As the liquid phase, any desired metal oxide mixture may be used. Generally, a melt composed of Ba, Cu and O is used. Such a liquid phase may be obtained by admixing at least two oxide sources selected from a source of copper oxide, a source of barium oxide and a source of BaCu oxide to form an admixture, the admixture being subsequently heated at a temperature of, for example, 880° C. for 40 hours. In this case, it is desirable that the molar ratio of Ba to Cu should be 3:5 to 3:8.

The weight ratio of the liquid phase to the solid phase is preferably 2–10 parts by weight per part by weight of the solid phase.

The solid phase and the liquid phase are contained in a crucible formed of a material which does not react with the liquid phase and which does not adversely affect the properties of the desired metal oxide crystal, such as yttria, magnesia, alumina or stabilized zirconia. The crucible is placed within a furnace or oven. The seed material is immersed in the liquid phase while gradually lowering the temperature of the liquid phase so as to cause the crystal of the desired Y123 metal oxide to deposit on the seed material and to grow. For the acceleration of the growth of the crystal, the temperature of the liquid phase adjacent to the seed material is made lower by about 20° C. at maximum than the pertectic temperature. In an alternative, the substrate is slowly pulled up at a rate of 0.01–10 mm per hour.

The following examples will further illustrate the present invention.

EXAMPLE 1

Preparation of Seed Material

A magnesia single crystal (substrate) in the form of a rod was heated so that the surface temperature was in the range of 600°–1,000° C. According to the plasma deposition method, a raw material oxide powder of Ln—Ba—Cu—O was vaporized and allow to deposit on the heated surface of the substrate. The substrate was then cooled to 300° C. in the atmosphere of oxygen to form an oriented film on the cleavage plane of the substrate. The plasma deposition was performed under the conditions summarized in Table below.

Raw Material Powder

Composition: $Y_{1.3}Ba_{2.2}Cu_{3.2}O_{7-d}$

Average particle diameter: 2–3 $\mu$m

Carrier Gas (feed rate): Ar (2 liter/minute)

Vacuum: 200 torr

High Frequency Power: 32 kW

Plasma Gas (feed rate): Ar (2 liter/minute)

Sheath Gas (feed rate): $O_2$(50 liter/minute)

Figure 2:
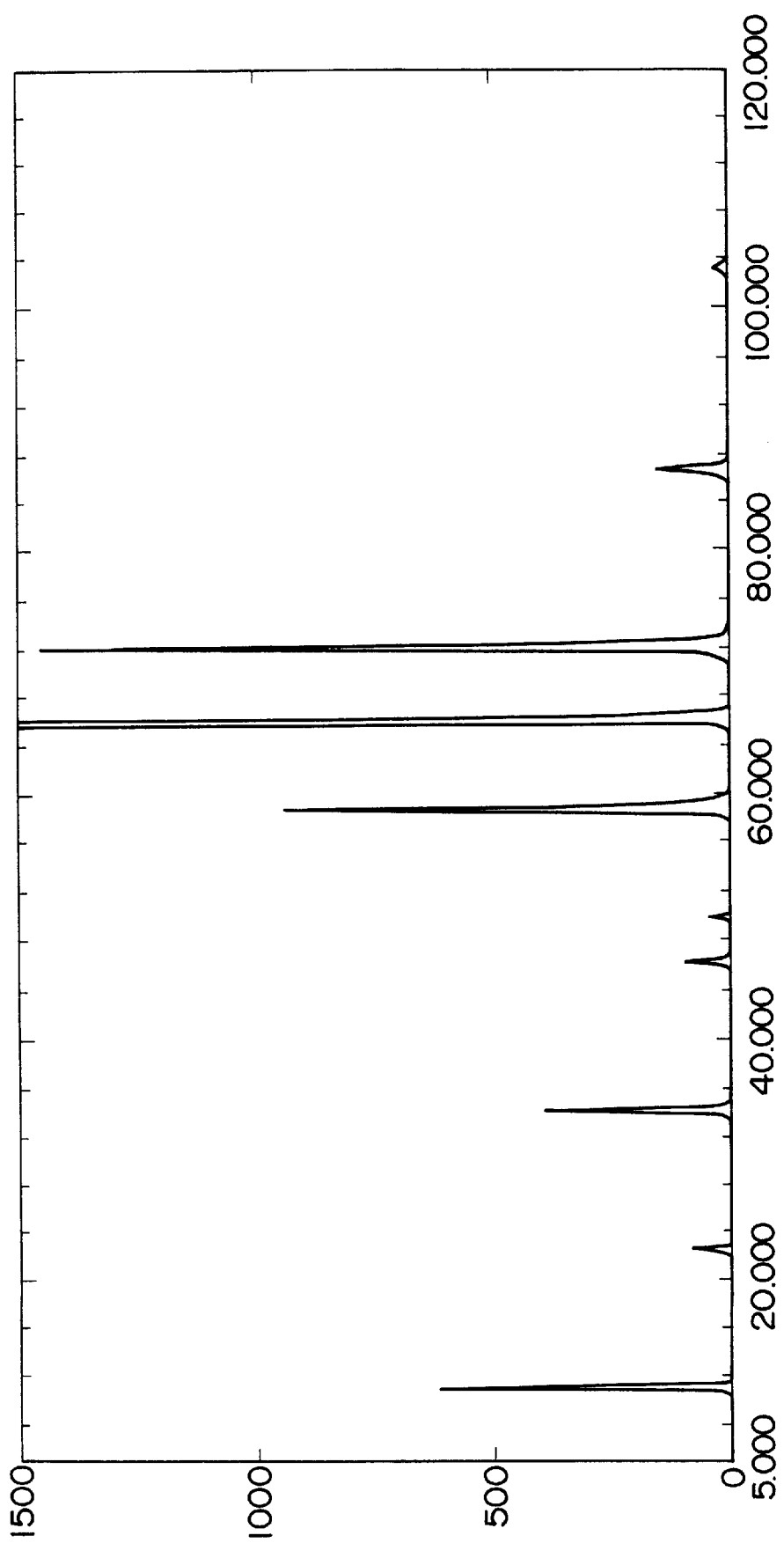
FIG. 2 is an X-ray diffraction pattern of a metal oxide film obtained in Example 1.

The X-ray diffraction pattern of the oriented film thus obtained is shown in FIG. 2. From the diffraction pattern, the c-axis of the oriented film is found to be oriented in the direction normal to the plane of the substrate. Some peaks oriented in the other directions also exist, suggesting that the orientation of the film is not uniform. The film has a Y123 crystal structure.

Formation of Y123 Crystal Layer

Figure 3:
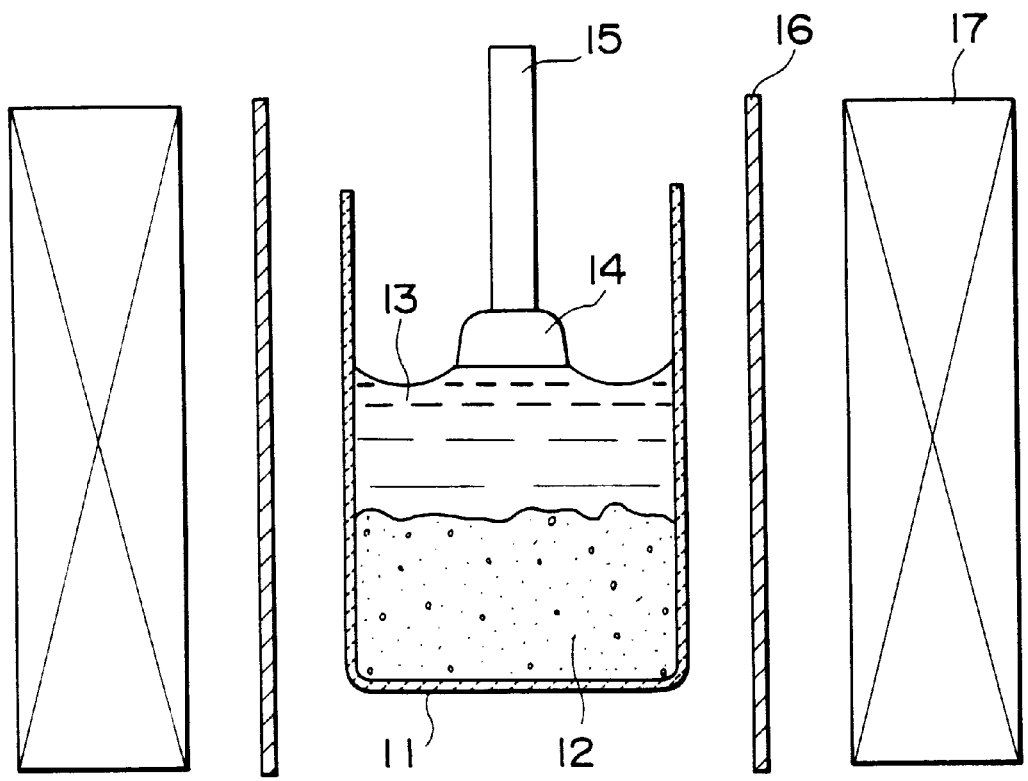
FIG. 3 is a cross-sectional, elevational view diagrammatically showing an apparatus useful for carrying out the method of the present invention.

As shown in FIG. 3, into a yttria crucible 11 having an inside diameter of 30 mm and a height of 50 mm were charged $Y_2BaCuO_5$ (solid phase) 12 and a calcined mass (liquid phase) 13 obtained by calcining a mixture of barium carbonate and copper oxide (a molar ratio of Ba/Cu of 3:5) at 880° C. for 40 hours. The crucible 11 was placed inside of a furnace having a platinum susceptor 16 and a high frequency coil 17 and the contents in the crucible 11 was heated to about 1,000° C. to melt the mixture of BaO and CuO (liquid phase 13) beneath which the solid phase 12 was present. Then, the above seed material having the oriented film 14 formed on the cleavage plane of the magnesia single crystal 15 was contacted with the melt in the crucible and, after lowering the temperature of the crucible by 20° C., was continuously pulled up at a rate of 0.2 mm per hour for about 50 hours while being rotated at 100 revolutions per minute (rpm), whereby a single crystal of $YBa_2Cu_3O_{7-x}$ was allowed to grow on the seed crystal bar as primary crystal.

The thus grown Y123 crystal layer had a mirror surface. The polarized microscope revealed that the Y123 crystal layer had good crystallinity and was free of grain boundaries though a twin plane was present.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A composite material comprising:

a substrate, a non-uniformly oriented film with a X-ray diffraction pattern showing a diffraction peak for one axis, which is normal to the plane of the substrate, and additional diffraction peaks, said non-uniformly oriented film having a thickness of 0.01–1 μm and provided on a surface of said substrate, said non-uniformly oriented film being formed of a metal oxide which has a crystal structure of a Y123 metal oxide and which has the formula:

wherein Ln stands for Y or an element belonging to the lanthanoid group and y is a number of 6–7, and a layer of a single crystal metal oxide provided over a surface of said non-uniformly oriented film and having the formula:

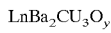

wherein Ln stands for Y or an element belonging to the lanthanoid group and y is a number of 6–7.

2. A composite material as set forth in claim 1, wherein said substrate is formed of a material which is substantially unwettable with a melt composed of Ba, Cu and O.

3. A composite material as set forth in claim 1, wherein said substrate is a crystal of a metal oxide containing an alkaline earth metal.

4. A composite material as set forth in claim 1, wherein said substrate is formed of a MgO crystal.

5. A composite material as set forth in claim 1, wherein said non-uniformly oriented film has been formed by a plasma deposition method.

6. A composite material as set forth in claim 1 wherein said one axis is the c-axis.

7. A composite material as set forth in claim 1 wherein said one axis is the a-axis.

\* \* \* \* \*

UNITED STATES PATENT AND TRADEMARK OFFICE
CERTIFICATE OF CORRECTION

PATENT NO. : 5,998,050
DATED : December 7, 1999
INVENTOR(S) : YAMADA et al

It is certified that error appears in the above-identified patent and that said Letters Patent is hereby corrected as shown below:

On the cover page under the heading "Inventors" the address for Mr. Masaru Nakamura, given as "Mitaka", should read --Tokyo--; and
the address for Mr. Kanshi Ohtsu, given as "Musashino" should read --Tokyo--.

On the cover page under the heading "Foreign Application Priority Data", the date "Jul.27, 1992" should read --Jul.27, 1993--.

On the cover page under the heading "OTHER PUBLICATIONS", the date of the first listed reference given as "Dec.3, 1996" should be --Dec.3, 1990--; and
the date of the second reference, given as "Jun. 1664" should read --Jun.1994--.

Column 1, line 4, "5,672,142" should read --5,627,142--.

Signed and Sealed this

Tenth Day of April, 2001

Attest:

NICHOLAS P. GODICI

*Attesting Officer*   *Acting Director of the United States Patent and Trademark Office*